United States Patent [19]

Mizunoya et al.

[11] Patent Number: 4,540,462
[45] Date of Patent: Sep. 10, 1985

[54] SUBSTRATE FOR SEMICONDUCTOR MODULES AND METHOD OF MANUFACTURE

[75] Inventors: Nobuyuki Mizunoya; Hajime Kohama; Yasuyuki Sugiura, all of Kanagawa, Japan

[73] Assignee: Tokyo Shibaura Denki Kabushiki Kaisha, Kanagawa, Japan

[21] Appl. No.: 558,583

[22] Filed: Dec. 6, 1983

[30] Foreign Application Priority Data

Dec. 23, 1982 [JP] Japan .................. 57-230399

[51] Int. Cl.³ .................. C23F 1/02; B44C 1/22; C03C 15/00; C03C 25/06
[52] U.S. Cl. .................. 156/630; 156/634; 156/656; 156/659.1; 156/666; 156/901; 156/89; 156/308.2
[58] Field of Search ........ 156/630, 634, 640, 656, 156/659.1, 666, 901, 902, 89, 306.6, 308.2, 308.6, 309.9; 65/50, 54, 55, 59.24, 59.34; 228/120–122, 196; 252/79.5, 79.2; 174/68.5; 361/395, 397

[56] References Cited

U.S. PATENT DOCUMENTS

| | | | |
|---|---|---|---|
| 3,328,145 | 6/1967 | McMillan et al. | 65/33 |
| 3,994,430 | 11/1976 | Cusano et al. | 228/122 |
| 4,293,356 | 10/1981 | Ebata et al. | 156/89 |
| 4,328,048 | 5/1982 | Senda et al. | 148/6.31 |

FOREIGN PATENT DOCUMENTS 3036128  4/1982  Fed. Rep. of Germany .

OTHER PUBLICATIONS

B.BC. Nachrichten, vol. 64, No. 7, 1982, pp. 196-200, Mannheim, DE. A. Neidig: "Neue Leistungs-Halbleiter-Module mit hofer Lastwechselfestigkeit".

Primary Examiner—William A. Powell
Attorney, Agent, or Firm—Cushman, Darby and Cushman

[57] ABSTRACT

A method for manufacturing a semiconductor substrate. A copper sheet is placed on a surface of a ceramic plate and bonded thereto. A circuit pattern is then formed on the copper sheet by an etching process.

16 Claims, 15 Drawing Figures

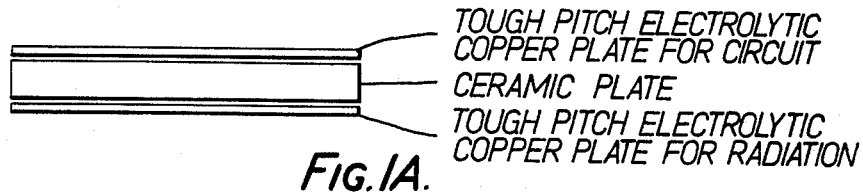
FIG. IA.
FIG. IB.
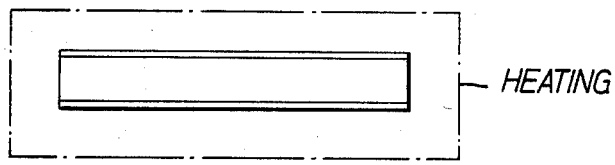
FIG. IC.
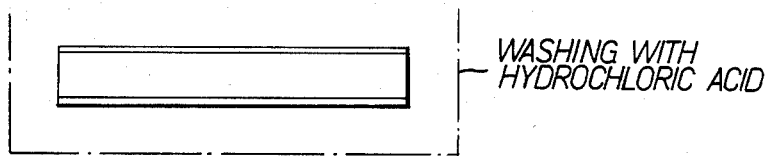
FIG. ID.
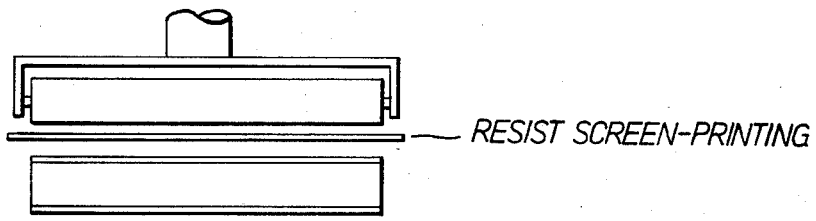
FIG. IE.

SUBSTRATE FOR SEMICONDUCTOR MODULES AND METHOD OF MANUFACTURE

BACKGROUND OF THE INVENTION

The present invention relates to a method manufacturing semiconductor substrates. Specifically, the present invention provides a novel method of manufacture.

A substrate for a semiconductor module generally includes a metal sheet such as copper sheet cladded onto a ceramic plate. It is known to metallize a surface of the ceramic plate by coating it with molybdenum paste and to then attach to it a previously formed circuit pattern stamped copper sheet, or molybdenum disc of prescribed shape by brazing the preformed metal sheet to the ceramic.

There is a problem with substrates formed in this manner. The thermal expansion coefficients of the metallic sheet and ceramic plate are different. When electronic components (such as silicon pellets) are mounted on the substrate, the ceramic plate and metallic sheet are heated and there is a tendency for the substrate to crack and split.

In addition to this functional problem of cracking and splitting during circuit component mounting, it is somewhat difficult and expensive to manufacture the substrate. The process of bonding via metallizing is a complicated process. This general type of manufacture is disclosed in U.S. Pat. No. 3,994,430—Cusano et al (Nov. 30, 1976), the teachings of which are incorporated herein by reference as if fully reproduced. A semiconductor module substrate produced according to the known process, described above, is shown in FIG. 9 of Cusano '430.

An alternative to the method taught in Cusano '430 includes the steps of stamping a copper sheet to a prescribed pattern, putting the patterned copper sheet into contact with the ceramic plate and placing it in a furnace to bond the copper sheet and the ceramic plate directly by heating. With a substrate produced by such a method, since the thermal expansion coefficient of the metallic sheet is close to that of the ceramic plate, the problem of splitting is minimized where parts such as silicon pellets are mounted directly onto the copper sheet. However with this alternative method there is the disadvantage of poor precision because prestamping copper plate to a complex shape is quite difficult.

SUMMARY OF THE INVENTION

The present invention overcomes the shortcomings of the arrangements discussed above by providing a novel manufacturing process for a semiconductor module substrate resulting in a higher quality substrate not suffering the precision problem. Without using any metallization, a ceramic plate and copper sheet are directly bonded to one another with no cracking. Patterns of complex shape for particular circuits are then formed (after the bonding process) by etching the copper sheet.

A copper sheet is contact laid on a ceramic plate and bonded thereto by heating. Then a pattern is formed on this copper sheet and the prescribed circuit is formed by etching. In accordance with one aspect of the present invention there is provided a substrate including a ceramic element and a copper circuit sheet having a pattern formed by etching which is directly bonded to the ceramic element.

A copper sheet is laid on a ceramic plate and bonded to it by heating. After bonding, a circuit pattern is formed on this copper sheet and the pattern is etched.

An advantage of the arrangement of this invention is that it is not limited in use to any particular type of ceramic plate. The ceramic plate used can be an oxide-type ceramic, such as for example, silicon oxide or alumina, or it can be a non-oxide ceramic such as for example aluminum nitride, titanium nitride and silicon nitride. In the case of non-oxide ceramics, it is appropriate to first carry out a surface treatment such as oxidation treatment before bonding the metal. When using aluminum nitride as the ceramic plate, substrates with superior heat dissipation can be obtained. For the copper sheet used in this invention, it is advantageous to use, for example, tough pitch electrolytic copper containing 100–2000 ppm oxygen. Where necessary, the copper sheet can be oxidation treated before use.

When using this type of copper sheet containing oxygen, the heating atmosphere should be a non-oxidative atmosphere; when using copper sheet which does not contain oxygen, heating should be done in an oxidative atmosphere.

BRIEF DESCRIPTION OF THE DRAWINGS

FIGS. 1A–1I illustrate the process steps associated with a first embodiment of the invention;

DETAILED DESCRIPTION OF THE PREFERRED EMBODIMENT

Figure 1F:
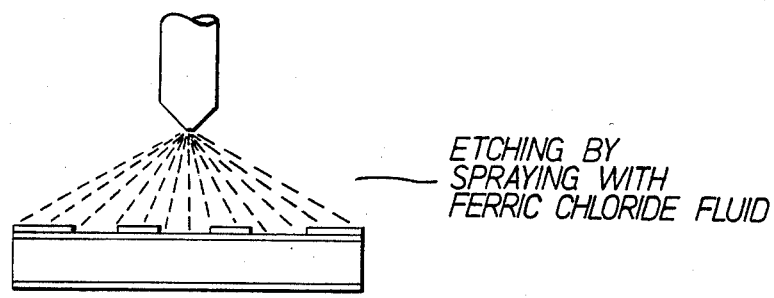
Figure 1G:
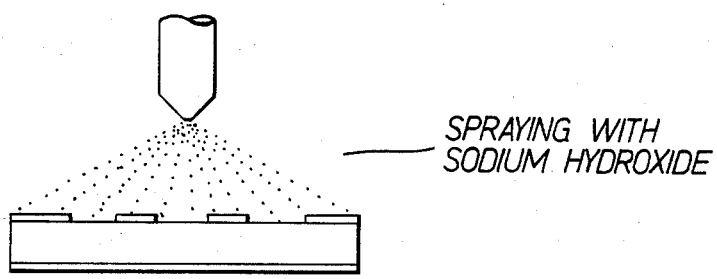
Figure 1H:
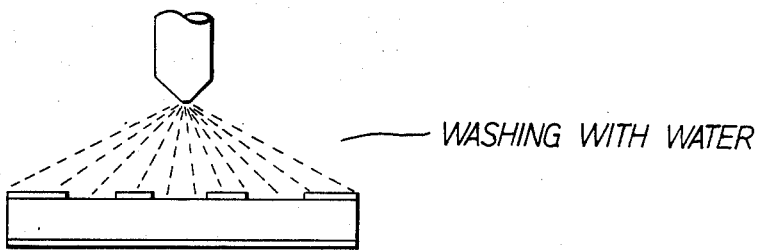
Figure 1I:
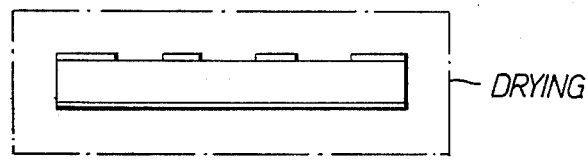

A copper sheet is contact laid on a ceramic plate. The combination is heated to a temperature below the melting point of the copper (1083° C.) and above the copper/copper oxide eutectic temperature (1065° C.) to a temperature zone where the copper reacts with the ceramic.

It is preferable but not mandatory to use a tough pitch electrolytic copper or copper that has been oxidation treated by a conventional method before use.

The ceramic member preferred is a nonoxide - type ceramic. Such as a nitride, e.g., silicon nitride, aluminum nitride, or titanium nitride, a carbide, e.g., silicon carbide or titanium carbide; a boride, e.g., lanthanum boride, or an oxide-type ceramic such as silica, alumina and zirconia.

For non-oxide ceramics, it is a preferable advantage to use them after carrying out a surface treatment such as oxidation treatment by a bonding agent.

A bonding agent to be used herein produces a eutectic in combination with a copper and may include oxygen, sulfur or the like. The addition of a bonding agent to the surface layer of the ceramic member may be performed by a conventional method. For example, when a ceramic plate consists of a nitride and the bonding agent is oxygen, the ceramic plate is heated to 1250 to 1500° C. in a wet-forming gas ($H_2 + N_2$), to achieve oxidation.

When sintering auxiliary is contained throughout the ceramic member, the sintering auxiliary may be contained in the form of a compound. For example, when the sintering auxiliary is oxygen, it may be contained in a nonoxide - type ceramic plate in the form of an oxide.

The oxide may be yttrium oxide, titanium oxide, alumina, silica, magnesium oxide, or a glass.

It is advantageous if the copper sheet is bonded to both surfaces of the ceramic plate, as the copper sheet on the reverse then also contributes to heat dissipation. One may also bond ceramic plate and copper sheet rather larger than the required shape, for subsequent cutting. Further, by using a copper sheet in the form of long tape wound into a roll, continuously feeding two copper sheets from such rolls to sandwich the ceramic plate between these copper sheets and applying heat in this state, the rate of production can be increased. After bonding copper sheet to ceramic plate in this way, acid washing is carried out to remove the oxide film from the surface of the copper sheet.

The pattern is then formed by screen printing, or the photo-resist method, and the etching process is carried out with copper chloride solution. By removing the resist, washing and then drying, the substrate for the semiconductor module is obtained.

Substrate for semiconductor modules obtained in this way is supplied for use in mounting silicon chips, etc. onto copper sheet.

EXAMPLE 1

A 28 mm ×58 mm ×0.3 mm copper sheet made of tough pitch electrolytic copper was contact laid on both surfaces of a 30 mm ×60 mm ×0.7 mm alumina ceramic plate and bonded by insertion for 30 minutes in a furnace at 1075° C. We next washed with hydrochloric acid and carried out resist screen-printing. (It is essential to wash with hydrochloric acid). Etching by spraying for 15–20 minutes with ferric chloride etching fluid and spraying with sodium by dioxide to peel off the resist, was followed by washing and drying. If necessary, one can provide a de-oil process step in which the vapor of trichlorothylene is used to remove oil from the surface of the copper sheet. This can be done before or after washing wih hydrochloric acid. Also, after each process step, there can be a washing with water.

The method steps of this example of the invention are illustrated in FIGS. 1A–1I.

EXAMPLE 2

Figure 2A:
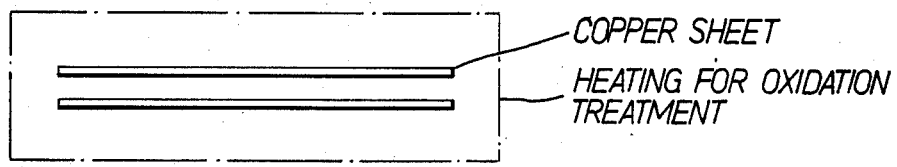
FIGS. 2A–2C illustrate some of the process steps associated with a second embodiment of the invention.
Figure 2B:
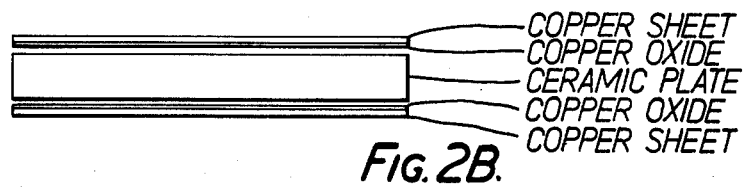
Figure 2C:

A 28 mm ×58 mm ×0.3 mm copper sheet was oxidation treated and contact laid on both surfaces of 30 mm ×60 mm ×0.7 mm alumina ceramic plate. We next carried out the same method as Example 1. The method steps of this example of the invention are illustrated in FIGS. 2A–2C.

EXAMPLE 3

Figure 3A:
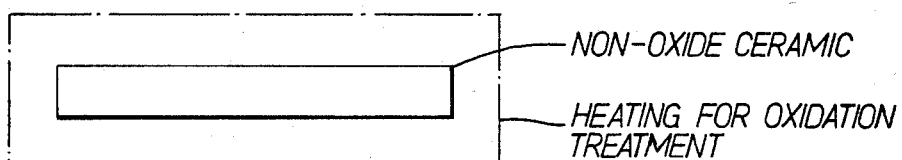
FIGS. 3A–3C illustrate some of the process steps associated with a third embodiment of the present invention.
Figure 3B:
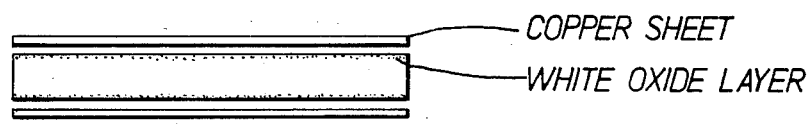
Figure 3C:

A ceramic plate was used which consisted of a silicon nitride containing 4% by weight of yttrium oxide and 4% by weight of alumina as a sintering auxiliary, and which had dimensions of 30 mm ×30 mm ×2 mm. The ceramic plate was heated at 1.250° C. in air for 1 hour and ceramic surface was slightly whitened. A copper sheet made of tough pitch electrolytic copper and having dimensions of 10 mm ×50 mm ×0.3 mm (300 to 500 ppm oxygen content) was brought into contact with the whited surface of the ceramic plate. Two members were then heated at 1075° C. in this state in a nitrogen atmosphere after the members were cooled to substantially ambient temperature, we next carried out the same method as Example 1. The method steps of this example of the invention are illustrated in FIGS. 3A–3C.

Even when silicon pellets are mounted by soldering on substrate for semiconductors manufactured in this manner problems such as cracking do not arise. It is, moreover, possible to form patterns of complex patterns with precision. Furthermore, with substrate for semiconductor modules obtained in this way, cracking does not occur during the mounting of components.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

We claim:

1. A method of manufacturing a substrate having a predetermined copper pattern for a semiconductor module comprising the steps of:
    providing a ceramic plate;
    providing a copper sheet;
    putting the copper sheet on a surface of the ceramic plate;
    bonding the copper sheet to the ceramic plate surface by heating them;
    forming the predetermined pattern on the copper sheet; and
    etching the copper sheet in accordance with the predetermined pattern to form the substrate.

2. A method according to claim 1 wherein the step of providing a copper sheet comprises the step of providing a tough pitch electrolytic copper sheet.

3. A method according to claim 1 further comprising before the step of putting the copper sheet on the ceramic plate, a step of oxidation treating the copper sheet.

4. A method according to claim 1 further comprising, before the step of putting the copper sheet on the ceramic plate, the step of applying a bonding agent to the surface of the ceramic plate onto which the copper sheet is to be put.

5. A method according to claim 4 further comprising the step of oxidation treating the bonding agent applied to the ceramic plate.

6. A method according to claim 4 wherein the step of providing a ceramic plate comprises the step of providing a non-oxide type ceramic plate.

7. A method according to claim 6 wherein the step of providing a non-oxide type ceramic plate comprises the step of providing a non-oxide type ceramic plate of a compound selected from the group consisting of: silicon nitride, aluminum nitride and silicon carbide.

8. A method according to claim 1 wherein the step bonding comprises the step of heating the ceramic plate and copper sheet to a temperature in the range of 1065°–1083° C.

9. A method of manufacturing a substrate having a predetermind copper pattern for a semiconductor module comprising the steps of:
    providing a ceramic plate;
    providing two copper sheets;
    putting the copper sheets on opposite surfaces of the ceramic plate;
    bonding the copper sheets to the ceramic plate by heating them;

forming the predetermined pattern on at least one of the copper plates; and etching at least the copper plate having the pattern formed therein to form the substrate.

10. A method according to claim 9 wherein the steps of providing copper sheets comprises the step of providing tough pitch electrolytic copper sheets.

11. A method according to claim 9 further comprising before the step of putting the copper sheets on the ceramic plate, the step of oxidation treating the copper sheets.

12. A method according to claim 9 further comprising, before the step of putting the copper sheets on the ceramic plate, the step of applying a bonding agent to the surfaces of the ceramic plate onto which the copper sheets are to be put.

13. A method according to claim 12 further comprising the step of oxidation treating the bonding agent applied to the ceramic plate.

14. A method according to claim 12 wherein the step of providing a ceramic plate comprises the step of providing a non-oxide type ceramic plate.

15. A method according to claim 14 wherein the step of providing a non-oxide type ceramic plate comprises the step of providing a non-oxide type ceramic plate of a compound selected from the group consisting of silicon nitride, aluminum nitride and silicon carbide.

16. A method according to claim 9 wherein the step bonding comprises the step of heating the ceramic plate and copper sheet to a temperature in the range of 1065°–1083° C.

* * * * *